United States Patent
Krvavac et al.

(10) Patent No.: US 7,064,615 B2
(45) Date of Patent: Jun. 20, 2006

(54) METHOD AND APPARATUS FOR DOHERTY AMPLIFIER BIASING

(75) Inventors: Enver Krvavac, Lake Zurich, IL (US); James E. Mitzlaff, Arlington Heights, IL (US); Mark I. Van Horn, Arlington, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/808,056

(22) Filed: Mar. 24, 2004

(65) Prior Publication Data
US 2005/0212602 A1  Sep. 29, 2005

(51) Int. Cl.
*H03F 3/14* (2006.01)
(52) U.S. Cl. .................. 330/307; 330/296
(58) Field of Classification Search ........... 330/307, 330/9, 124 R, 295, 84, 296
See application file for complete search history.

(56) References Cited

U.S. PATENT DOCUMENTS

| | | | |
|---|---|---|---|
| 2,210,028 A | | 8/1940 | Doherty |
| 4,074,181 A | * | 2/1978 | Crowle ................. 323/226 |
| 5,420,541 A | | 5/1995 | Upton et al. ............ 330/286 |
| 5,739,723 A | | 4/1998 | Sigmon et al. .......... 330/295 |
| 5,757,229 A | * | 5/1998 | Mitzlaff ................ 330/124 R |
| 6,046,642 A | | 4/2000 | Brayton et al. ......... 330/296 |
| 6,097,252 A | | 8/2000 | Sigmon et al. .......... 330/136 |
| 6,262,629 B1 | * | 7/2001 | Stengel et al. ......... 330/124 R |
| 6,731,173 B1 | * | 5/2004 | Thompson ............. 330/296 |
| 2003/0141933 A1 | | 7/2003 | Pengelly ............... 330/295 |

* cited by examiner

*Primary Examiner*—Henry Choe
(74) *Attorney, Agent, or Firm*—Fulbright & Jaworski LLP

(57) ABSTRACT

Apparatus and methods are described for biasing amplifiers with multiple outputs. A semiconductor die may include a reference Field Effect Transistor (FET) integrated on the semiconductor die and coupled to an amplifier integrated on the semiconductor die. A voltage offset circuit may also be integrated on the semiconductor die for determining the voltage needed to operate the amplifier.

14 Claims, 2 Drawing Sheets

METHOD AND APPARATUS FOR DOHERTY AMPLIFIER BIASING

BACKGROUND OF THE INVENTION

1. Field of the Invention

The invention relates generally to the field of amplification circuits, more particularly, to automatic biasing of amplifiers.

2. Discussion of the Related Art

In a power amplifier, the direct current (DC), or quiescent current biasing point is a critical design parameter. The quiescent current has significant effects on the characteristics and performance, e.g., linearity, signal distortion, power efficiency, etc., of the amplifier. The optimal DC biasing point of a transistor in an amplifier depends on the application of the amplifier and the characteristics of the transistor, which are affected by environmental surroundings such as temperature variations, process variations, and the like.

An example of a power amplifier is the Doherty Amplifier. The Doherty topology has been used widely in sophisticated and high power application. Traditionally, a Doherty amplifier includes a plurality of peaking amplifiers in which each peaking amplifier requires a different bias level. However, the quiescent conditions of these peaking amplifiers are not easily measurable. Further, amplifier devices are known to have varying characteristics that make it difficult to preset all stages to a predetermined value.

Current methods for biasing these peaking amplifiers employ an off-chip bias that is factory set for each peaking amplifier. Similarly, for configurations such as radio-frequency integrated circuits (RFIC) in a Doherty amplifier configuration, two integrated circuits are needed to bias both the carrier amplifier devices and the peaking amplifier devices. In this configuration, at least one of the integrated circuits is an off-chip, factory bias set. However, for amplifier architectures with multiple output stages, this method becomes inefficient and expensive.

The referenced shortcomings are not intended to be exhaustive, but rather are among many that tend to impair the effectiveness of previously known techniques concerning biasing for amplifier architecture; however, those mentioned here are sufficient to demonstrate that the methodologies appearing in the art have not been altogether satisfactory and that a significant need exists for the techniques described and claimed in this disclosure.

BRIEF DESCRIPTION OF THE DRAWINGS

The drawings accompanying and forming part of this specification are included to depict certain aspects of the invention. The invention may be better understood by reference to one or more of these drawings in combination with the description presented herein. Identical or similar elements use the same element number. It should be noted that the features illustrated in the drawings are not necessarily drawn to scale.

DETAILED DESCRIPTION

Shortcomings of conventional biasing of amplifier architectures are addressed by the techniques of this disclosure. In particular, the techniques of this disclosure provide an on-chip, automatic biasing circuitry coupled to an amplifier. An amplifier architecture, having multi-parallel output stage amplifiers, using the techniques of this disclosure is more efficient, much more robust, and is cost-effective when compared to today's off-chip, factory biasing methods.

In general, the present invention provides an on-chip, automatic self-biasing scheme for power amplifiers. In one embodiment of the invention, a semiconductor die may include at least one amplifier, bias circuitry coupled to the at least one amplifier, voltage offset circuitry coupled to the bias circuitry, where the bias circuitry and voltage offset circuitry are adapted to bias the at least one amplifier.

In accordance to one embodiment of the invention, a method for biasing an amplifier includes providing a semiconductor having an amplifier, a bias circuit for tracking device parameters of the amplifier, and a voltage offset circuit, the voltage offset circuit for determining where the amplifier will operate and for calculating a biasing voltage for the amplifier based on the device parameters.

In accordance to another embodiment of the invention, a method includes providing a semiconductor die having a first and second amplifier, a biasing circuit for providing a reference voltage to the second amplifier, and a voltage offset circuit, the voltage offset circuit for providing a reference voltage to the first amplifier and for automatically biasing the first amplifier proportionally to the second amplifier.

These and other features and embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

Figure 1A:
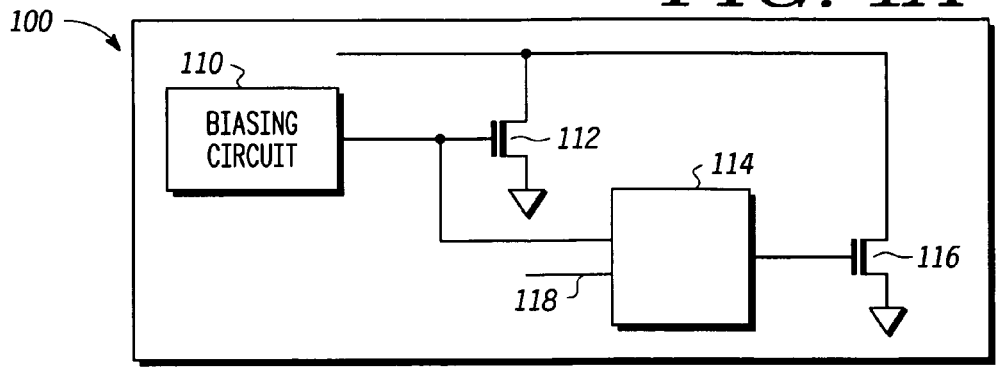
FIG. 1A is a block diagram of a die including a biasing circuit and a peaking amplifier, in accordance with an embodiment of the present invention.

According to one embodiment of the present disclosure, a biasing circuit is provided to bias a peaking amplifier, where the biasing circuit is fabricated on the same die as the peaking amplifier, as illustrated in FIG. 1A. Die 100 may include a reference FET 112 coupled to a peaking amplifier transistor 116. During the operation of the amplifier on die 100, variations such as the die temperature may cause device characteristics of the peaking amplifier transistor 116 to vary. The reference FET 112, having been fabricated on the same die as transistor 116, automatically tracks variations in device parameters such as the threshold voltage ($V_{th}$) or the transconductance ($g_m$) of the peaking amplifier transistor 116. Accordingly, in one embodiment of the present disclosure, biasing of the peaking amplifier transistor is based on the quiescent conditions of reference FET 112. Furthermore, the method includes dynamically adjusting the offset voltage circuitry 114 based on die temperature, process variations, or load conditions.

In particular, gate voltage of the peaking amplifier transistor 116 is set based on the gate voltage of the reference FET 112. Biasing circuit 110 is coupled to the gate terminal of the reference FET 112 such that the reference FET 112 is biased to a desired current density. For example, reference FET 112 operates in an ON mode in response to gate voltage $V_g$ greater than a threshold voltage $V_{th}$. The gate voltage of the reference FET 112 is also coupled to a voltage offset circuitry 114. The voltage offset circuitry 114 is adapted to determine the drive level at which the peaking amplifier transistor will be turned to an ON mode and operate in a Doherty mode. As such, the voltage offset circuitry 114 couples to the gate terminal of the peaking amplifier transistor 116. In one embodiment, the voltage offset circuitry 114 uses the gate voltage of the reference FET 112 minus an offset voltage 118 to determine the operation mode of the peaking amplifier transistor 116. The offset voltage 118 is set to a predetermined value corresponding to a gate voltage that would have the peaking amplifier transistor 116 operate in an ON mode at a predetermined input voltage drive level. Alternatively, the offset voltage 118 may also be adjusted to account for different operating conditions (for example, single carrier or multi-carrier applications).

As shown in FIG. 1A, biasing circuit 110, reference FET 112, voltage offset circuits 114, and peaking amplifier transistor 116 are all integrated on the same semiconductor die 100.

Figure 1B:
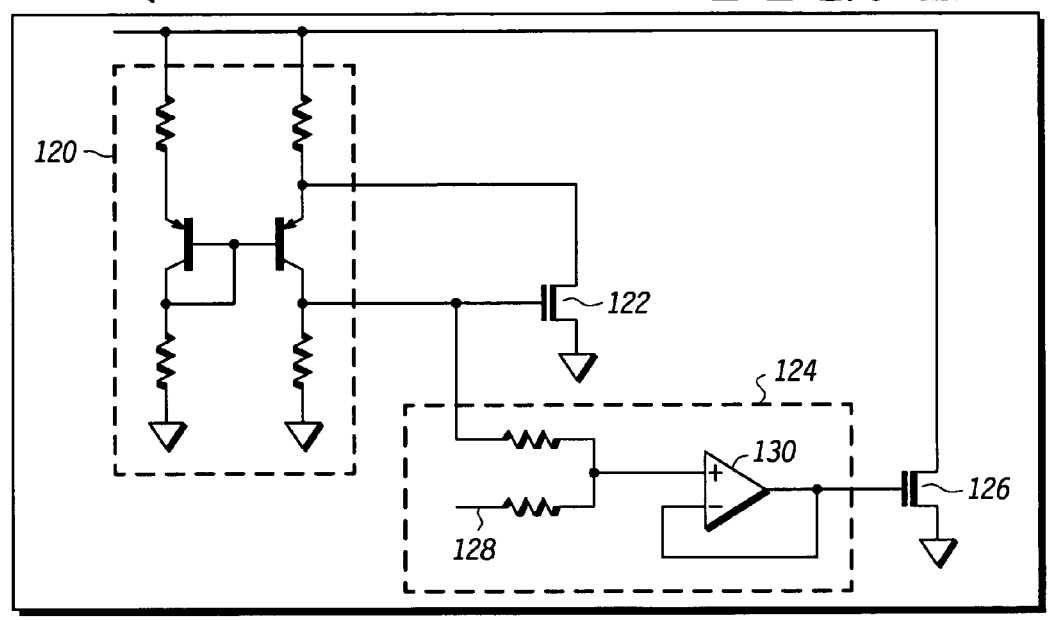
FIG. 1B is a circuit diagram of an on-chip biasing circuit coupled to a peaking amplifier, in accordance with an embodiment of the present invention.

Different circuit implementation is adapted to provide an automatic, on-chip biasing of the peaking amplifier transistors. According to one embodiment of the invention, biasing circuit 120 may include, but is not limited to, a current mirror adapted to bias reference FET 122 to a particular current density, as illustrated in FIG. 1B. The gate voltage of reference FET 122 is used to determine the gate voltage of the peaking amplifier transistor 126. Accordingly, voltage offset circuitry 124 includes two parallel resistors coupled to a buffer to determine a gate voltage for the peaking amplifier transistor 126 using offset voltage 128 and $V_g$ of the reference FET 122. In one embodiment, a voltage divider is used to calculate and determine the gate voltage for the peaking amplifier transistor 126. Additionally, the voltage offset circuitry may include feedback amplifier 130 to select the gate voltage for the peaking amplifier transistor 126. In one embodiment, if the device parameters of the peaking amplifier transistor have changed, the gate voltage needed for the peaking amplifier transistor to operate in an ON mode may need to be changed. Accordingly, amplifier 126 is provided with a bias voltage determined from the reference FET 122 and voltage offset circuitry 124. Similarly, if the peaking amplifier transistor 126 is operating in the correct mode, feedback amplifier 130 on die 100 continues to provide the same gate voltage to peaking amplifier transistor 126, as illustrated by a feedback loop to the amplifier.

Once again, as shown in FIG. 1B, biasing circuit 120, reference FET 122, voltage offset circuitry 124, and peaking amplifier transistor 126 are all integrated on the same semiconductor die 100.

Additionally, other circuit components may be used to implement the on-chip, self-biasing of the peaking amplifier transistor. In one embodiment, the reference FET 112 includes a bias FET. In another embodiment, the reference FET 112 includes, but is not limited to, a carrier amplifier. The carrier amplifier may be part of an amplifier circuitry, such as a multi-chip combined linear power amplifier (CLPA) multiple output amplifier.

EXAMPLES

Specific embodiments of the invention will now be further described by the following, nonlimiting examples which will serve to illustrate in some detail various features. The following examples are included to facilitate an understanding of ways in which the invention may be practiced. It should be appreciated that the examples which follow represent embodiments discovered to function well in the practice of the invention, and thus can be considered to constitute preferred modes for the practice of the invention. However, it should be appreciated that many changes can be made in the exemplary embodiments which are disclosed while still obtaining like or similar result without departing from the spirit and scope of the invention. Accordingly, the examples should not be construed as limiting the scope of the invention.

Example 1

Figure 2:
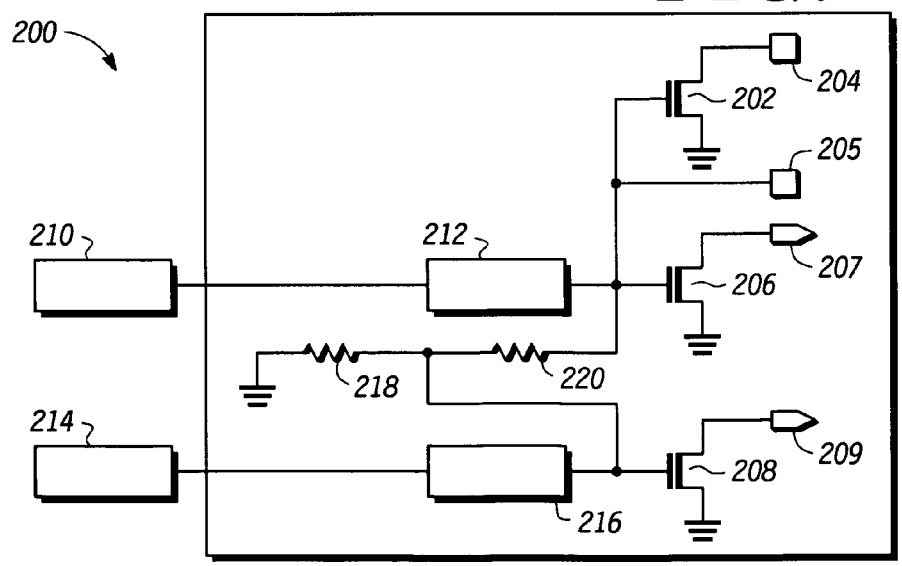
FIG. 2 is a circuit diagram of an on-chip biasing circuit for a RFIC amplifier, in accordance with an embodiment of the present invention.

FIG. 2 illustrates a portion of a Doherty amplifier configuration utilizing an RFIC. Particularly, die 200 includes a self-bias FET 202 integrated thereof, with inputs 204 and 205. Die 200 may also include a carrier amplifier transistor 206 with input circuit 212 that is matched to the input power source 210 and coupled to output 207. Further, die 200 may include a peaking amplifier transistor 208 with input circuit 216 that is matched to the input power source 214 and coupled to output 209. In one embodiment, outputs 207 and 209 couple to loads of the respective amplifiers 206 and 208, in which the loads are external to die 200. In an integrated amplifier configuration for Doherty amplifiers, the characteristics of the peaking amplifier transistor and the carrier amplifier transistor would typically be similar. As such, the bias for the peaking amplifier transistor 208 is proportional to the bias for the carrier amplifier transistor 206. The gate voltage of the self-bias FET 202 is coupled to the gate terminal of the carrier amplifier transistor 206. To insure the bias for the peaking amplifier transistor 208 is proportional to the bias of the carrier amplifier transistor 206, the gate voltage to the carrier amplifier transistor is coupled to a resistor divider, the resistor divider network including resistors 218 and 220. The voltage from the network divider is provided to the gate terminal of peaking amplifier transistor 208.

As illustrated in FIG. 2, the self-bias FET 202, carrier amplifier transistor 206, peak amplifier 208, input circuits 212 and 216, and the resistor divider network including resistors 218 and 220 are all integrated on the same semiconductor die 200.

Example 2

Figure 3:
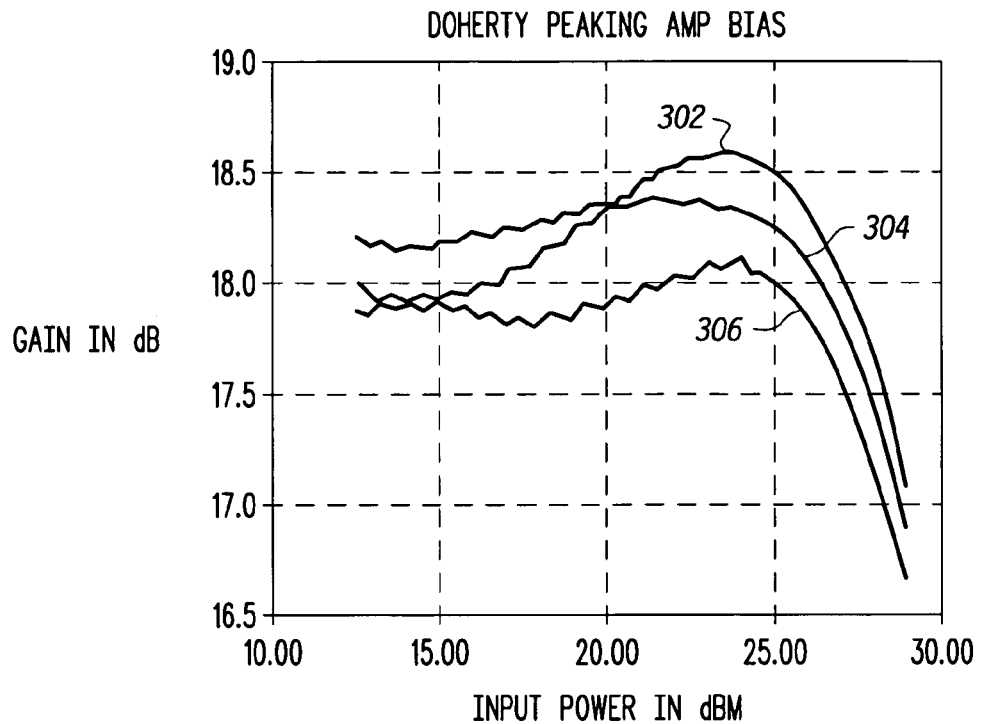
FIG. 3 is a graph showing the gain of Doherty amplifier relative to the input power, in accordance with an embodiment of the present invention.
Figure 4:
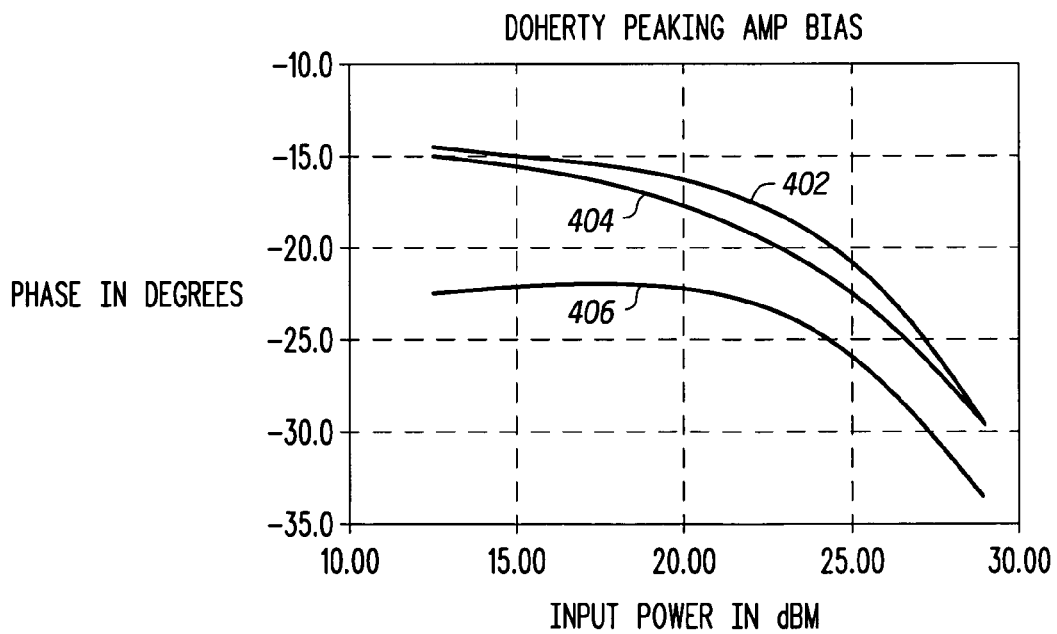
FIG. 4 is a graph showing the phase of a Doherty amplifier relative to the input power, in accordance with an embodiment of the present invention.

FIG. 3 and FIG. 4 illustrate the results of automatic biasing of a peaking amplifier transistor in a Doherty amplifier configuration, in which a reference FET is on the same die with the amplifier. Particularly, FIG. 3 illustrates the gain (dB) of the Doherty amplifier relative to the input power (dBm) and a corresponding compensation for variations in device parameters during operation of the amplifier. The highest gain observed was for graph line 302 which at approximately 23 dBm, the gain was about 18.7 dB for a gate voltage of 2.5 Volts (V) for the peaking amplifier transistor. At a gate voltage of 2 V, the maximum gain was observed at an input power of about 24 dBm, illustrated by graph line 306. For a gate input voltage of 2.3 V, the maximum gain of the peaking amplifier transistor was observed at an input power of 22 dBm, as illustrated by graph line 304.

Similarly, FIG. 4 illustrates the phases (in degrees) of the Doherty amplifier relative to the input power and a corresponding compensation for variations in device parameters during operation of the amplifier. Graph line 402 refers to a gate voltage of 2.5 V applied to the gate terminal of a peaking amplifier transistor. Graph line 406 refers to a gate voltage of 2 V and graph line 404 refers to a gate voltage of 2.3 V applied to the gate terminal of a peaking amplifier transistor.

All the disclosed embodiments of the invention disclosed herein can be made and used without undue experimentation in light of the disclosure. It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

What is claimed is:

1. An amplifier circuit, comprising:
   a semiconductor die;
   a Doherty amplifier integrated on the semiconductor die, the Doherty amplifier including a peaking amplifier and a carrier amplifier coupled to the peaking amplifier;
   a resistor divider network integrated on the semiconductor die and coupled to the carrier amplifier, the resistor divider network biasing the peaking amplifier; and
   a self-bias Field Effect Transistor which automatically tracks variations in device parameters of the peaking amplifier integrated on the semiconductor die and coupled to the Doherty amplifier,
   the self-bias Field Effect Transistor and resistor divider network together biasing the Doherty amplifier.

2. An amplifier circuit, comprising:
   a semiconductor die;
   a first and second amplifiers integrated on the semiconductor die;
   a resistor divider network integrated on the semiconductor for biasing the first amplifier; and
   a self-bias Field Effect Transistor which automatically tracks variations in device parameters of the first amplifier integrated on the semiconductor die and coupled to the second amplifier;
   the self-bias Field Effect Transistor and resistor divider network together biasing the second amplifier.

3. The amplifier circuit of claim 2, the first amplifier comprising a peaking amplifier.

4. The amplifier circuit of claim 3, the second amplifier comprising a carrier amplifier coupled to the peaking amplifier.

5. The amplifier circuit of claim 4, the peaking amplifier being coupled to the carrier amplifier via the resistor divider network.

6. The amplifier circuit of claim 4, the self-bias Field Effect Transistor being coupled to the carrier amplifier.

7. A method, comprising:
   providing a semiconductor die having an amplifier integrated on the semiconductor die, a self-bias Field Effect Transistor integrated on the semiconductor die, and a resistor divider network integrated on the semiconductor die;
   operating the self-bias Field Effect Transistor to track device parameters of the amplifier; and
   operating the self-bias Field Effect Transistor and the resistor divider network to bias the amplifier based on tracked changes to the device parameters of the amplifier.

8. The method of claim 7, the amplifier comprising a peak amplifier.

9. The method of claim 7, the amplifier comprising a carrier amplifier.

10. The method of claim 7, the step of tracking device parameters comprising tracking a threshold voltage and transconductance of the amplifier.

11. A method, comprising:
    providing a semiconductor die comprising
      a first and second amplifier integrated on the semiconductor die;
      a self-bias Field Effect Transistor which automatically tracks variations in device parameters of the first amplifier integrated on the semiconductor die, and
      a the resistor divider network integrated on the semiconductor die;
    operating the self-bias Field Effect Transistor to provide a reference voltage to the second amplifier; and
    operating the resistor divider network bias the first amplifier proportional to the reference voltage of the second amplifier.

12. The method of claim 11, the first amplifier comprising a peaking amplifier and the second amplifier comprising a carrier amplifier.

13. The method of claim 1, the self-bias Field Effect Transistor being coupled to a gate terminal of the carrier amplifier.

14. The method of claim 1, the self-bias Field Effect Transistor tracking device parameters of the peaking amplifier.

* * * * *

UNITED STATES PATENT AND TRADEMARK OFFICE
CERTIFICATE OF CORRECTION

PATENT NO. : 7,064,615 B2  Page 1 of 1
APPLICATION NO. : 10/808056
DATED : June 20, 2006
INVENTOR(S) : Krvavac et al.

It is certified that error appears in the above-identified patent and that said Letters Patent is hereby corrected as shown below:

In column 6, line 36 of claim 11, please replace "a the" with --a--.

Signed and Sealed this

Thirty-first Day of October, 2006

JON W. DUDAS
*Director of the United States Patent and Trademark Office*